United States Patent [19]

Feldman

[11] Patent Number: 4,490,655

[45] Date of Patent: Dec. 25, 1984

[54] BI-DIRECTIONAL DRIVER SYSTEM FOR ELECTRICAL LOAD

[75] Inventor: Alan S. Feldman, Phoenix, Ariz.

[73] Assignee: Sperry Corporation, New York, N.Y.

[21] Appl. No.: 425,012

[22] Filed: Sep. 27, 1982

[51] Int. Cl.³ .............................................. H02P 1/22
[52] U.S. Cl. .................... 318/294; 318/256; 318/293; 318/291; 318/287; 307/254; 307/262; 307/454
[58] Field of Search .............. 318/125, 256, 280, 281, 318/282, 289, 286, 287, 291, 293, 294; 307/254, 255, 256, 257, 262, 445, 446, 454, 455, 457, 459

[56] References Cited

U.S. PATENT DOCUMENTS

| | | | |
|---|---|---|---|
| 3,427,520 | 2/1969 | Oppedahl | 318/294 X |
| 3,437,842 | 4/1969 | Brouwer | 307/254 |
| 3,471,103 | 10/1969 | Gabor | 318/293 X |
| 3,496,441 | 2/1970 | Heider et al. | 318/294 X |
| 3,525,883 | 8/1970 | Iordanidis | 318/293 X |
| 3,770,986 | 11/1973 | Drehle | 307/255 X |
| 3,824,440 | 7/1974 | McIntosh | 318/696 |
| 4,358,724 | 11/1982 | Haner | 318/681 |
| 4,367,435 | 1/1983 | Bailey et al. | 318/280 X |
| 4,423,366 | 12/1983 | Gottwald | 318/696 |

OTHER PUBLICATIONS

National Semiconductor Corp. Special Functions Data Book, 1979 Ed., pp. 9-14, 9-15, 9-16, DS0025/DS0025C, Two-phase MOS clock driver.
Popular Electronics (May 1964, Ed. pp. 78, 79).

*Primary Examiner*—J. V. Truhe
*Assistant Examiner*—Paul Shik Luen Ip
*Attorney, Agent, or Firm*—Howard P. Terry; Arnold L. Albin

[57] ABSTRACT

A bi-directional driver system for an electrical load operable in response to two independent logic command signals provides a means for selecting the direction of current flow in the load when driven by the external command. A bridge circuit employs inputs to dual transistor switches operating in the saturated mode in series with the electrical load, cooperating with common emitter transistor linear amplifiers and diodes, and biased by the input logic signal so as to drive the load current in a predetermined direction. The circuit provides protection from undesired power supply current surges when logic command signals are applied to both inputs, and from transients due to failure of a saturated transistor switch at one input to cease conducting before the application of a command signal to the second input. Embodiments for inductive loads and annunciator lamps are described.

10 Claims, 4 Drawing Figures

BI-DIRECTIONAL DRIVER
WITH SURGE SUPPRESSION

BI-DIRECTIONAL DRIVER SYSTEM FOR ELECTRICAL LOAD

BACKGROUND OF THE INVENTION

1. Field of the Invention

The invention relates to systems for interfacing logic level control signals within an electrical load, and more particularly to a bi-directional control system for motor loads.

2. Description of the Prior Art

Systems for di-directional control of electrical loads, and in particular inductive loads, in response to logic level pulse commands, have taken several configurations in the prior art. The general requirements for such systems are good efficiency, small size and weight, and in particular freedom from current surges during change of the direction of load energization and from latch-up conditions which result either in directional ambiguity or in component failure due to excessive heat dissipation. One previous approach employed a complementary pair of transistor drivers in common emitter configuration. This approach has the disadvantage of requiring dual power supplies of opposed polarity and, when interfaced with logic level control signals, additional buffering and level shifting circuitry. Further, should control signals be applied to both inputs simultaneously, thereby energizing both output drivers, there could result the series interconnection of the power supplies of opposing polarities with resulting short-circuit catastrophic failure. Further, even in the absence of simultaneous application of the dual logic inputs, should a second input signal be applied immediately after the removal of the first input signal, a large current surge could result. This is attributed to the time for a saturated transistor switch, as commonly used, to turn off. Such period can be appreciably greater than the period for turning on. Thus, for a short interval of time, both directional drivers would be activated. This again results in the direct coupling of the power supplies of opposing polarity which effects the aforesaid short-circuit condition. In order to minimize this condition, an improved prior art circuit incorporated "dead-time" generation circuitry into the control system. Dead-time is herein defined as the delay between the time of turning off a first output device and reducing the consequent flow of current in a first selected direction to zero value, to the time of turning on a second output device and inducing the corresponding flow of current in the opposing direction. Such protection was afforded by cross-coupling the input and outputs of the respective drivers by means of diodes in order to inhibit the operation of one of two output drivers in the event both drivers were energized simultaneously, and by adding combinations of resistance, capacitance and diodes to each of the respective driver inputs thereby inhibiting activation of a second driver circuit until the current was dissipated in the first driver circuit, and conversely. With this configuration, the ambiguous condition or latching condition will only occur with a component failure in the control circuitry.

Another approach of the prior art, requiring only one power supply, employs common-emitter drivers in a bridge-type circuit. Because of the bridge configuration, however, this circuit requires twice the number of active power devices as of the prior art system using a duplex supply. This circuit does eliminate the need for level shifting circuitry; however, in order to provide appropriate synchronism of the driver elements of the bridge cirbuit, additional logic level buffering must be provided in the control circuitry. As in the first prior art configuration control signals applied simultaneously or without appropriate delay between two input signals could result in catastrophic failure or logic ambiguity in the direction of energization of the electrical load. Therefore, as in the second prior art system, it was found necessary to provide additional protective circuitry to preclude latch-up occurrence.

While such prior art devices have provided satisfactory electrical performance, their relative complexity and large parts count has lead to efforts of simplification which have resulted in the present invention. A third prior art configuration using common-emitter drivers and low level transistor switches in a bridge configuration has also been employed. While permitting greatly reduced parts complexity, the circuit has also suffered from the aforementioned problems of latch-up in a potential race condition in which current through the driver continues even after the input signal has been removed. If the load is inductive and possesses sufficient energy storage capacity, it may result in catastrophic failure of the driver element.

SUMMARY OF THE INVENTION

According to the present invention an efficient relatively simple system for providing a bi-directional drive to an electrical load, and in particular an inductive load, is provided. A bi-directional driver has two independent command inputs operable from a single system power source which energizes the load, such as a motor, in a first predetermined polarity in response to a command applied to the first input, and in a second opposite polarity when a command is applied to a second input. When commands are applied to both of the inputs, the load is deenergized. A transistor switch is actuated in response to an input logic level command signal so as to present a short circuited output to ground. The transistor is operated in the saturated mode to provide a minimal voltage drop in the "on" condition. The transistor switch is further coupled to an amplifier operating in the linear mode, said amplifier being self biased, and coupled to the power supply to provide current drive to the load. Coupled to the load, the linear amplifier, and the transistor switch is a diode, so biased as to cut off the associated linear amplifier when its associated transistor switch is closed in response to an input command, thereby effectively removing the available power source from the associated load terminal. A second similar set of components, including an input transistor switch, a linear amplifier, and a shunt diode is coupled to the power supply and to an opposing terminal of the load and operates in a similar fashion to energize the load in an opposing polarity. The circuit is so configured that in the presence of an input command signal, the associated transistor switch and diode will be biased to conductivity, while the associated linear amplifier will be biased to cut-off, thereby providing a ground path and cutting off the power source to the associated terminal of the load. Contrarywise, at the second input, where no input command signal is applied, the second transistor switch and second diode are biased to cut-off, thereby permitting the second linear amplifier to couple energy from the power source into the second associated load terminal. Thus, depending on which of two inputs is energized by an input command signal, energization in a corresponding polarization will be furnished to the load. In the event of coincidental inputs to both of the transistor switches, both of the linear amplifiers will be biased to cut-off by their associated shunt diode, thereby resulting in removal of energization from the load, thus avoiding any possible latch-up condition.

DESCRIPTION OF THE PREFERRED EMBODIMENTS

Figure 1:
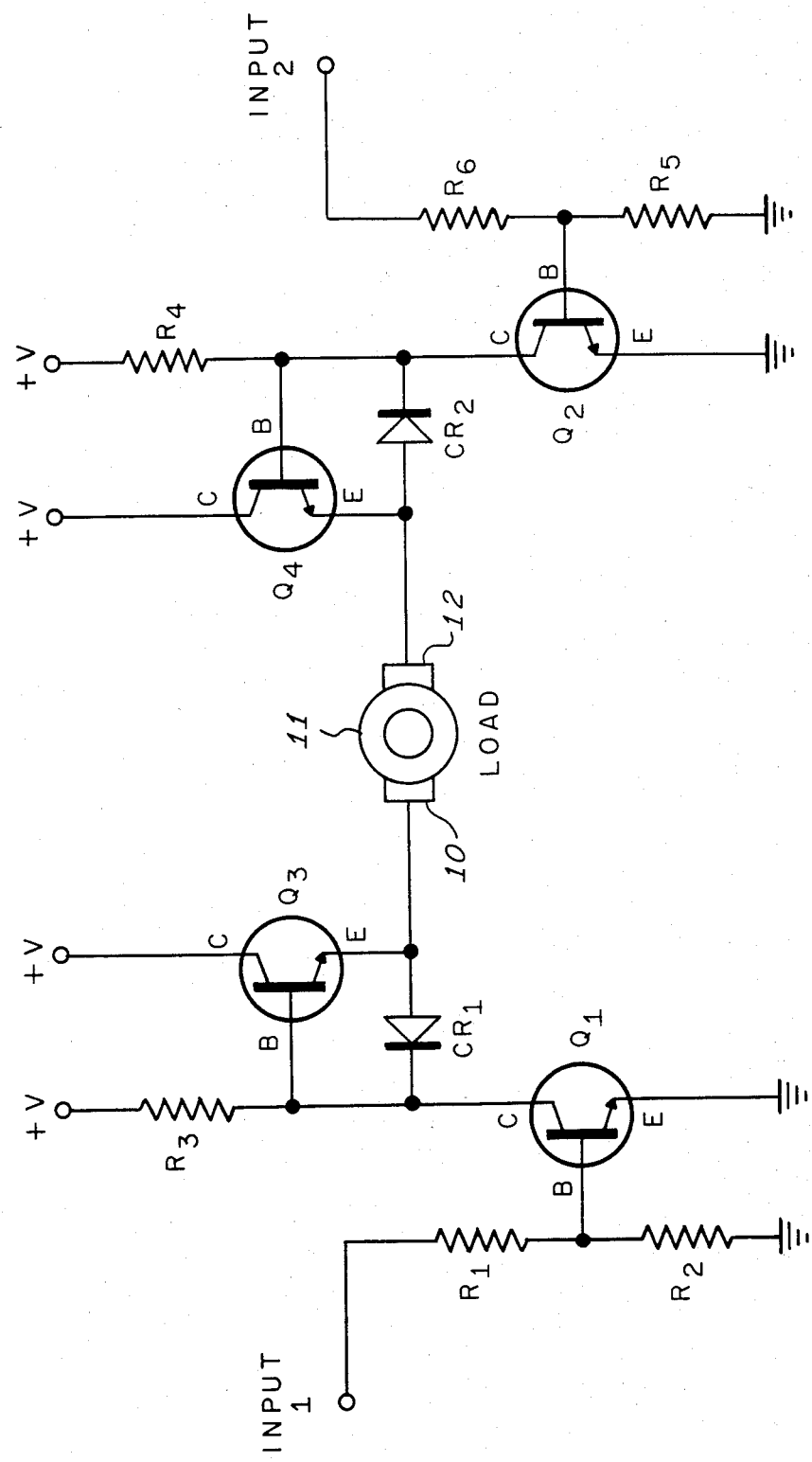
FIG. 1 is a schematic wiring diagram of the invention showing its electrical components and their interconnections.

Referring now to the Figures, in which the same or similar elements are represented by a single number, FIG. 1 presents details of the novel bi-directional driver circuit for energizing an electrical load in response to one or two digital input signal commands. A first digital input signal command is applied at Input 1 from an external source, not shown, which may be a conventional pulse generator. Network R1, R2 serves to bias the base B of switching transistor Q1. Emitter E of Q1 is connected to the ground plane. Transistor Q3 is connected as an emitter-follower, operating as a linear amplifier. The collector C of Q3 is energized by an external power supply +V, not shown. The base B of Q3 is returned to the supply +V through resistor R3 selected to provide a suitable bias potential at B for driving load 11. The common node of resistor R3 and base B of Q3 is returned to the collector of transistor Q1 and to the cathode of diode CR1. The anode of diode CR1 is coupled to emitter E of Q3 and terminal 10 of load 11 which may be any suitable electrical load such as a motor drive. It should be understood that the power supply +V and apparatus for forming the input logic commands at Input 1 and Input 2 are conventional devices forming no essential part of the present invention so that they need not be dealt with in detail herein. The circuitry of Q1, CR1, Q3, and associated bias resistors may be formed from discrete components or supplied in the form of a monolithic chip such as DS0025 as furnished by National Semiconductor Corporation, Santa Clara, CA.

Similarly, a second logic input command signal is applied to Input 2 which biases the base B of transistor switch Q2 through associated resistor network R6 and R5. One end of resistor R5 and the emitter E of transistor Q2 are connected to the ground plane. Collector C of Q2 is connected at a common node to the cathode of diode CR2, the base of linear amplifier emitter-follower transistor Q4, and one end of bias resistor R4. Power source +V also feeds the base B of transistor Q4 through bias resistor R4. The anode of diode CR2 is connected in common with the emitter E of transistor Q4 to terminal 12 of load 11. Finally, the power source +V is also connected to collector C of transistor Q4. If the input command is a bipolar signal, resistors R2 and R5 may be replaced by diodes to provide suitable bias.

In the initial state, with no signals applied to Input 1 or Input 2, transistors Q1 and Q2 will be in a nonconducting state due to the lack of driving bias at the base B of the respective transistors. Therefore, no current will flow through the collector emitter paths of Q1 and Q2. Amplifiers Q3 and Q4 are self biased by the application of power source +V to resistors R3 and R4 respectively, thus permitting the power source voltage +V to appear, except for the voltage drop inherent in the transistor junctions at terminals 10 and 12 of load 11. Since transistors Q1 and Q2 are nonconducting, and a common potential is applied at terminals 10 and 12 of load 11, no current flows through the load. A positive pulse of sufficient magnitude applied to Input 1 will bias the base B of Q1 through resistor network R1, R2 causing transistor Q1 to be driven into saturation. The voltage appearing at terminal 10 of load 11 will be equal to the sum of the voltage drops across diode CR1 and the collector-emitter junction of Q1. However, the voltage drop across CR1 effectively applies negative bias to the base B of transistor Q3 thereby biasing transistor Q3 to cut-off and diverting the current flowing through resistor R3 through transistor Q1 to ground, thereby assuring a cut-off condition of transistor Q3. Thus, terminal 10 of load 11 is substantially at ground potential. Since no signal has been applied to Input 2, transistor Q2 remains in the cut-off state or open circuited, thereby allowing the bias voltage developed across R4 to appear at base B of transistor Q4, also biasing diode CR2 in the reverse direction so that no current flows therein, and permitting substantially the full power source voltage +V to appear at terminal 12 of load 11 through amplifier Q4. In consequence, current will flow from terminal 12 to terminal 10 of load 11. If, now, the input applied to Input 1 is removed or has been switched off, such that Q1 turns off Q3 will receive base current drive through resistor R3, turning Q3 on. This will supply current from the power source +V to load 11 and the output at terminal 10 will swing positive to V-V$_{CE}$. It should be observed that Q1 must be switched to the off condition before enabling transistor Q3 to supply current to load 11, hence large internal transients between power supply +V and ground cannot occur. Continuing the analysis, if a second digital input control signal is now applied to Input 2, transistor Q2 will be biased to saturation, through resistor network R5, R6, permitting diode CR2 to conduct, thereby biasing linear amplifier Q4 to cut-off and removing the power source +V from terminal 12 of load 11. Since terminal 10 of load 11 is now essentially at power source voltage, and terminal 12 is essentially at ground potential, the current flow through load 11 is reversed and if load 11 embodies a motor or other shaft driven device, the direction of rotation will also be reversed.

It is thus apparent that the undesirable prior art condition of shorting the power supply due to inappropriate coincidental or overlapping application of digital command signals to Input 1 and Input 2 cannot cause any adverse effects. Consider, for example, the state where such logic control voltages are inadvertently applied to both inputs simultaneously, or where a second input is applied before the initial input has been removed or decayed. In this case, both transistors Q1 and Q2 will be turned on in the saturation condition. Diodes CR1 and CR2 will be in the conducting mode, resulting in biasing corresponding associated transistors Q3 and Q4 to the nonconducting condition, and thereby diverting any base drive from the emitter-followers Q3 and Q4 through Q1 and Q2, respectively to ground. Since both terminals 10 and 12 of load 11 are now essentially at ground potential, no current will flow in the load, thus the circuit exhibits a function corresponding to that of an exclusive-or gate and provides a break-before-make switch action which prevents current surges through the power supply.

Figure 2:
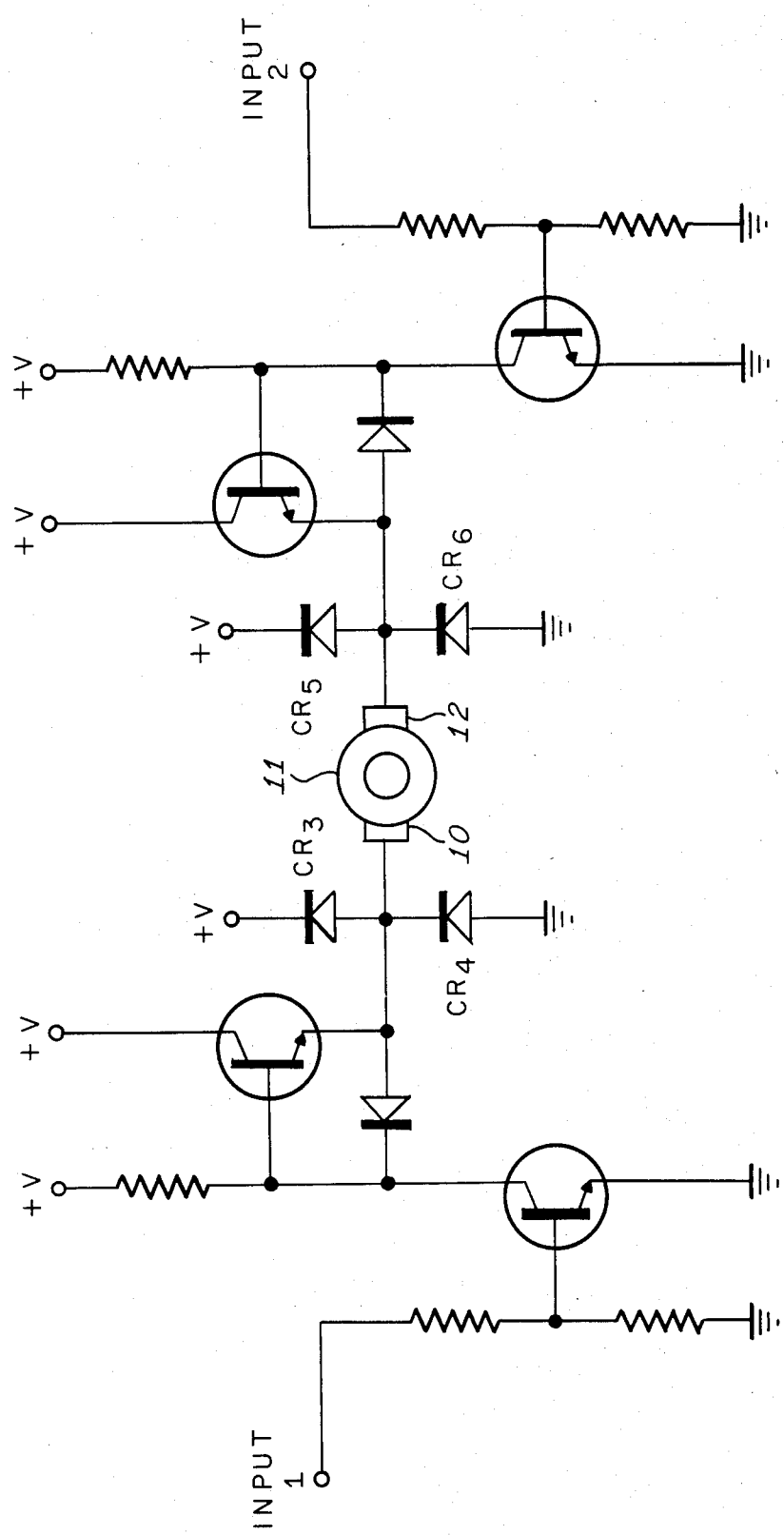
FIG. 2 is a diagram of the basic invention showing additional surge supression components associated with a motor inductive load.

In a second preferred embodiment, shown in FIG. 2, diodes CR4 and CR6 are connected cathode-to-terminal and anode-to-ground to corresponding terminals 10 and 12, respectively, of load 11. Diodes CR3 and CR5 are connected cathode-to-power source and anode-to-terminals 10 and 12, respectively. When the driver is used with an inductive load, on removal of the logic command signal from the inputs, the current previously flowing through the load will induce a magnetic field. When collapsing, the magnetic field will induce a back EMF across the load which may reach hundreds of volts. To prevent failure of any associated semiconductor components, diodes CR3–CR6 are provided as shown in FIG. 2. By providing a conductive path from ground to the power source in shunt with load 11, prospective voltage transients are suppressed. Thus, for example, if an initial command signal is applied to Input 1, current will flow from terminals 12 to 10 through load 11. At this time diodes CR3–CR6 are biased to cut-off. On removal of the command signal from Input 1, the collapsing magnetic field around inductive load 11 attempts to create an induced voltage of polarity in opposition to that initially applied in order to sustain the current flow through the inductive load. Thus, terminal 10 will momentarily be polarized highly positive with respect to terminal 12, while terminal 12 will be driven negative with respect to ground potential. Thus, surge current will be permitted to flow from ground through CR6 through terminals 12 and 10 of load 11 through diode CR3 to power source +V. Since power source +V will normally have an extremely low output impedance, the induced voltage across load 11 will not be permitted to exceed the equivalent series diode drop of CR3 and CR6. Similarly, when the logic command is initially applied to Input 2 and then removed, a current surge in the opposite direction will be experienced, thus providing a conductive path from ground through CR4, terminal 10 to 12, and through CR5 to the power source V.

In the aforementioned application load 11 embodied a DC motor drive. In another embodiment, the electrical load is constituted by a three-position flag drive motor. In this application, load 11 has a drive armature, spring loaded to return to a center position when not energized, and bearing an indicator flag. On applying a signal to Input 1, as in FIG. 1, the flag driver will rotate, for example, counter clock-wise by reason of the current flow from the power supply +V through transistor Q4 through terminals 12 to 10 of load 11 and thereupon through diodes CR1 and transistor switch Q1 to ground. The motor will continued its counter clockwise rotation until it reaches a mechanical stop where a sector of the flag is displayed through an indicator window. On removal of the signal from Input 1 and application of a digital command to Input 2, the current flow through load 11 will be reversed, the circuit associated with Input 2 operating in reciprocal fashion, and the motor will thereupon initiate a clock-wise rotation until reaching a second mechanical stop where another sector of the flag will be displayed. Applying the principles of the preceeding discussion of FIG. 1, if digital command input signals are applied to both Input 1 and Input 2 or applied to neither, there will be no rotation of the flag driver 11, and it will be positioned by the armature spring to maintain a center position.

Figure 3:
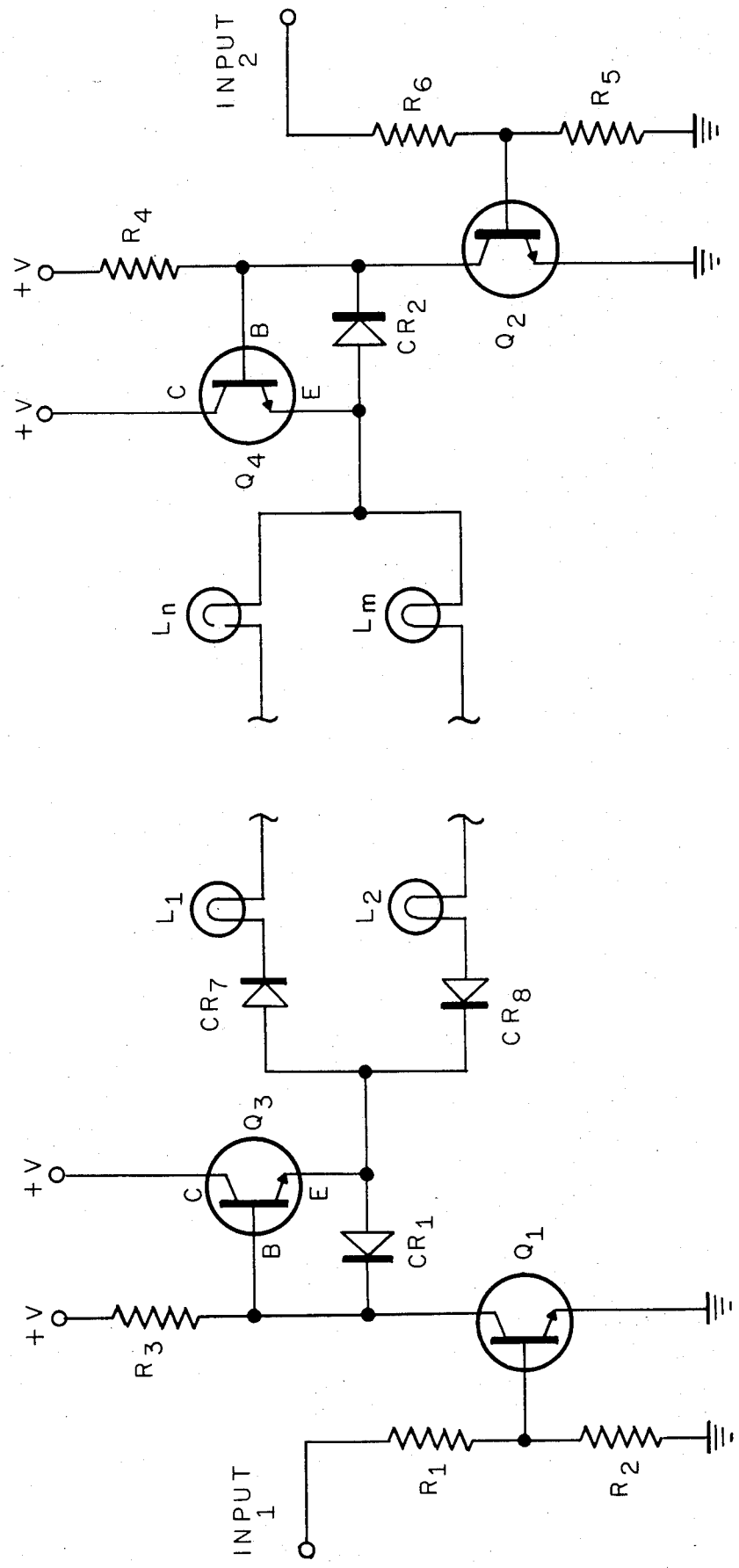
FIG. 3 shows the driver circuit of FIG. 1 modified for use with an annunciator lamp display.

In another embodiment, shown in FIG. 3 the electrical load comprises two parallel arrays of lamps. It should be noted that lamps $L_1$ through $L_n$ are in series with a diode CR7, lamp $L_1$ being coupled for example to the cathode of CR7, and the anode of CR7 being coupled to emitter E of transistor amplifier Q3. A multiplicity of lamps $L_1$-$L_n$ in series connected, with the free end of lamp $L_n$ coupled to the emitter E of transistor amplifier Q4. Similarly, a series array of lamps $L_2$-$L_m$ are connected between a diode CR8 and transistor Q4, lamp $L_2$ being connected at its free end to the anode of diode CR8 and lamp $L_m$ being connected at its free end to lamp $L_n$ and the emitter E of transistor amplifier Q4. The cathode of diode CR8, in turn, is coupled to the parallel connection of the anode of CR7 and emitter E of transistor amplifier Q3. It is to be observed that diode CR7 and CR8 may be interchanged, one with the other, it being important only to maintain the opposing polarizations of each diode as shown in FIG. 3. Now energizing Input 1 will permit transistor Q1 and diode CR1 to conduct, allowing the flow of current from power source +V through transistor amplifier Q4 and lamp array CR8, $L_2$-$L_m$. Note that due to the opposing polarity of CR7 it is biased to prohibit conduction through lamps $L_1$-$L_n$. If now the signal is removed from Input 1 and an enabling signal is applied to Input 2, a current flow will be permitted from power source +V through transistor amplifier Q3 to lamp array CR7, $L_1$-$L_n$, and further through diode CR2 and transistor switch Q2 to ground, thus lighting lamps $L_1$-$L_n$. Here, since CR8 is now reverse biased, no current flows in lamp string $L_2$-$L_n$. As heretofore explained, applying input signals to both Input 1 and Input 2, thereby biasing Q1 and Q2 to the "on" condition will apply reverse bias to the base B of transistor amplifiers Q3 and Q4 through diodes CR1 and CR2, respectively, thus providing equal voltages at emitter E of Q3 and emitter E of Q4, extinguishing both lamp strings.

Figure 4:
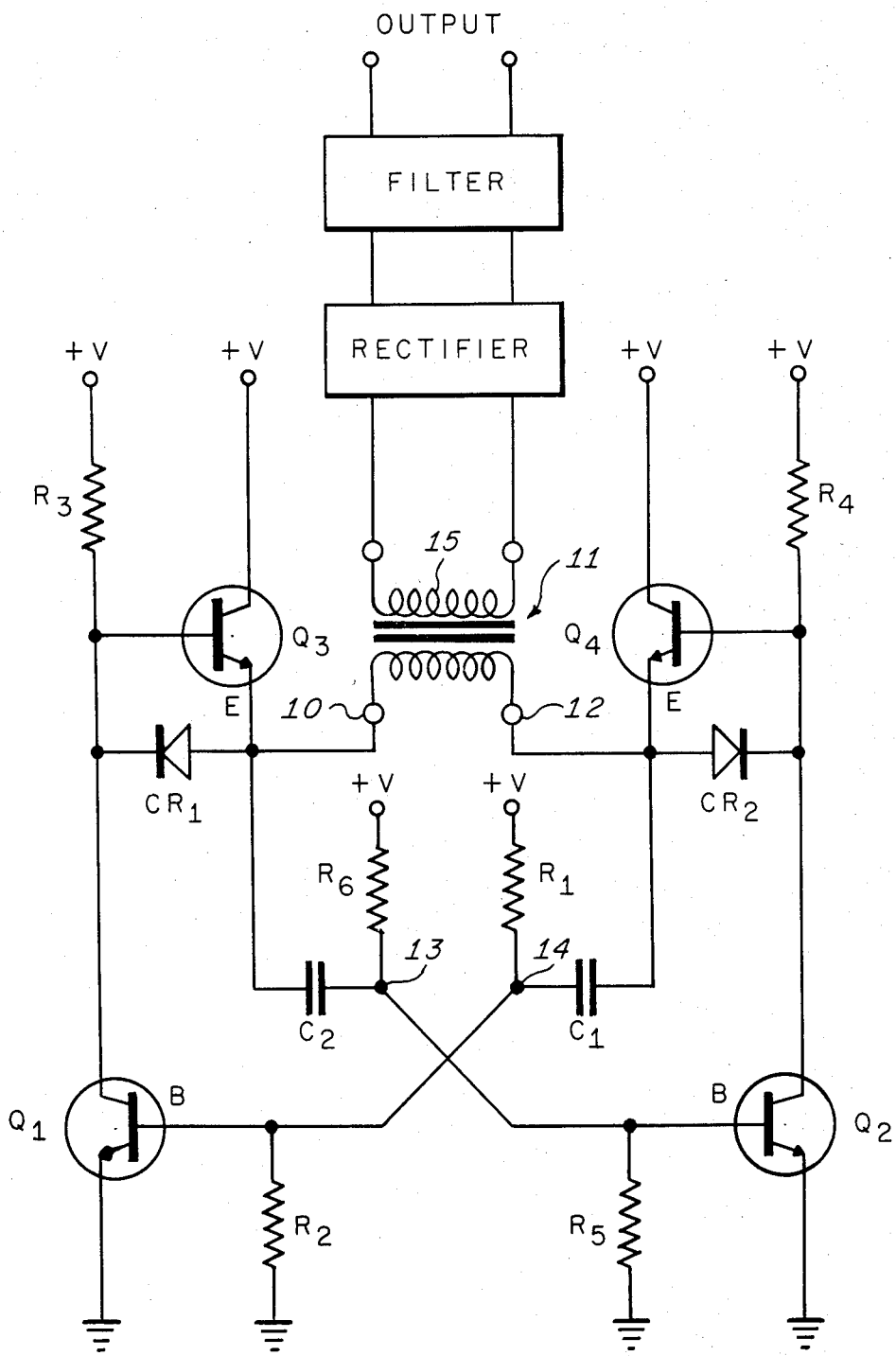
FIG. 4 is a version of the invention of FIG. 1 employing an asymmetrical multivibrator configuration for providing a low-voltage power output.

A fourth preferred embodiment is shown in FIG. 4. In this embodiment, load 11 is comprised of a step-down transformer used to provide an isolated DC power source. Terminal 10 of the primary winding of transformer 11 is coupled to the emitter E of transistor amplifier Q3. This point is further connected to one side of timing capacitor C2. Capacitor C2 is further connected at junction 13 to voltage source +V through resistor R6 and to the base of switching transistor Q2. Terminal 12 of the primary winding of transformer 11 connects to emitter E of transistor amplifier Q4, the anode of diode CR2, and a capacitor C1. Capacitor C1 is further connected at node 14 to power source +V through resistor R1 and to the base B of transistor switch Q1 at the junction with bias resistor R2.

It should be noted that by coupling the base of transistor Q1 to the emitter E of transistor amplifier Q4 and the corresponding base of transistor switch Q2 to the emitter E of transistor amplifier Q3, a regenerative circuit is formed constituting an astable multivibrator, the frequency of which may be determined by well-known means by the combination of time constants of R1, R2, C1 and R5, R6, C2. In consequence of the self-induced switching action of the circuit, the current at terminals 10 and 12 of transformer 11 will constitute an essentially square wave of alternating polarity. The output of transformer 11 at secondary winding 15 may be rectified and filtered as desired to provide an essentially direct current power source.

Accordingly, it is seen that the novel circuit of the invention overcomes difficulties in prior art bi-directional switching of electrical loads by employing a bridge circuit with dual inputs to transistor switches operating in the saturated mode in series with the electrical load, cooperating with common-emitter transistor linear amplifiers and diodes biased by the input logic signal so as to drive the load current in a predetermined direction. Beneficially, the circuit provides freedom from undesired power supply current surges when logic command signals are applied coincidentally to both inputs, and from transients due to failure of a saturated transistor switch at one input to cease conducting immediately on removal of the energizing logic at one input and application to a second input.

While the invention has been described in its preferred embodiments, it is to be understood that the words which have been used are words of description rather than of limitation and that changes may be made within the purview of the appended claims without departing from the true scope and spirit of the invention in its broader aspects.

I claim:

1. A bi-directional driver system for an inductive electrical load, said load having a first terminal and a second terminal, having two independent command inputs, operable from a power source supplying power between the system and ground so as to energize said load in a predetermined polarity in response to a first command signal applied to a first input, and in an opposing polarity in response to a second command signal applied to a second input, and for inhibiting operation when said first and second command signals are coincidentally but not necessarily simultaneously applied to their respective inputs, comprising:

(a) first amplifier means coupled to said power source for supplying energization to said electrical load, having first and second output terminals, said first output terminal coupled to said first terminal of said electrical load, and responsive to inhibitive bias from first unidirectional coupling means, (b) first switch means having an input and an output, said input responsive to said first command signal, and said output coupled to said second output terminal of said first amplifier, for commanding a first polarity of energization of said electrical load during said first switch operation, (c) said first unidirectional conducting means connected in shunt relationship with said first and second outputs of said first amplifier means and in series relationship with said first switch means output and said first terminal of said electrical load, biased to couple said electrical load to ground through said first switch means when said first switch means is energized by said first command signal, and further biased to inhibit operation of said first amplifier means when said first unidirectional conducting means is in a conductive mode, (d) second amplifier means coupled to said power source for supplying energization to said electrical load, having first and second output terminals, said first output terminal coupled to said second terminal of said electrical load, and responsive to inhibitive bias from second unidirectional coupling means, (e) second switch means having an input and an output, said input responsive to said second command signal, and said output coupled to said second output terminal of said second amplifier, for commanding a second polarity of energization of said electrical load during said second switch operation, (f) said second unidirectional conducting means, connected in shunt relationship with said first and second outputs of said second amplifier and in series relationship with said second switch means output and said second terminal of said electrical load, biased to couple said electrical load to ground through said second switch means when said switch means is energized by said second command signal, and further biased to inhibit operation of said second amplifier means when said second unidirectinal conducting means is in a conductive mode and a plurality of unidirectional conducting means, coupled between each of said inductive load first and second terminals and said power source and ground respectively, biased to be nonconducting during energization of said load, for suppressing inductive transient surges when said load is deenergized or reversed in polarity.

2. The unidirectional conducting means of claim 1, further comprising diode means, having an anode and a cathode, at least two of such diode means having said cathodes coupled to said power source and said anodes coupled to one of each of said inductive load terminals, and at least two further diode means having said cathodes coupled to ground, and said anodes coupled to one of each of said inductive load terminals, whereby an inductive surge of any polarity from a collapsing magnetic field during the deenergization of said inductive load will be suppressed from damaging associated control circuitry.

3. The inductive load of claim 2, further comprising a drive motor having an armature pivoted for rotation about an axis, an indicator member coupled for cooperative rotation with said armature, means responsive to said energization for rotating said armature about said axis in a first direction to a first position corresponding to said first command signal and for urging said armature against mechanical stop means, means responsive to said energization for rotating said armature about said axis to a second position in a direction opposing said first direction corresponding to said second command signal and for urging said armature against further mechanical stop means, spring means for returning said armature to a position intermediate said first and second positions when said armature is de-energized, and window means indicative of the position of said armature for displaying said indicator member in at least said first, second, and intermediate positions.

4. The inductive load of claim 2, further comprising a DC driver motor.

5. A bi-directional driver system for an electrical load, said load having a first terminal and a second terminal, having two independent command inputs, operable from a power source supplying power between the system and ground so as to energize said load in a predetermined polarity in response to a first command signal applied to a first input, and in an opposing polarity in response to a second command signal applied to a second input, and for inhibiting operation when said first and second command signals are coincidentally but not necessarily simultaneously applied to their respective inputs, comprising:
(a) first amplifier means coupled to said power source for supplying energization to said electrical load, having first and second output terminals, said first output terminal coupled to said first terminal of said electrical load, and responsive to inhibitive bias from first unidirectional coupling means,
(b) first switch means having an input and an output, said input responsive to said first command signal, and said output coupled to said second output terminal of said first amplifier, for commanding a first polarity of energization of said electrical load during said first switch operation,
(c) said first unidirectional conducting means connected in shunt relationship with said first and second outputs of said first amplifier means and in series relationship with said first switch means output and said first terminal of said electrical load, biased to couple said electrical load to ground through said first switch means when said first switch means is energized by said first command signal, and further biased to inhibit operation of said first amplifier means when said first unidirectional conducting means is in a conductive mode,
(d) second amplifier means coupled to said power source for supplying energization to said electrical load, having first and second output terminals, said first output terminal coupled to said second terminal of said electrical load, and responsive to inhibitive bias from second unidirectional coupling means,
(e) second switch means having an input and an output, said input responsive to said second command signal, and said output coupled to said second output terminal of said second amplifier, for commanding a second polarity of energization of said electrical load during said second switch operation,
(f) said second unidirectional conducting means, connected in shunt relationship with said first and second outputs of said second amplifier and in series relationship with said second switch means output and said second terminal of said electrical load, biased to couple said electrical load to ground through said second switch means when said switch means is energized by said second command signal, and further biased to inhibit operation of said second amplifier means when said second unidirectional conducting means is in a conductive mode,
(g) said electrical load further comprising a drive motor having an armature pivoted for rotation about an axis, an indicator member coupled for cooperative rotation with said armature, means responsive to said energization for rotating said armature about said axis in a first direction to a first position corresponding to said first command signal and for urging said armature against mechanical stop means, means responsive to said energization for rotating said armature about said axis to a second position in a direction opposing said first direction corresponding to said second command signal and for urging said armature against further mechanical stop means, spring means for returning said armature to a position intermediate said first and second positions when said armature is deenergized, and window means indicative of the position of said armature for displaying said indicator member in at least said first, second, and intermediate positions.

6. A bi-directional driver circuit for an electrical load, said load having a first terminal and a second terminal, having two independent command inputs, operable from a power source supplying power between the system and ground so as to energize said load in a predetermined polarity in response to a first command signal applied to a first input, an in an opposing polarity in response to a second command signal applied to a second input, and for inhibiting operation when said first and second command signals are coincidentally but not necessarily simultaneously applied to their respective inputs, comprising:
(a) at least two transistor amplifiers, operating in emitter-follower linear mode, the emitter of each coupled to one of said terminals of said electrical load, for coupling said electrical load through a collector electrode to said power source when energized, and for deenergizing said load when base biased to cut-off, and each having a base electrode responsive to control bias from an associated control diode,
(b) at least two said control diodes, each having an anode and cathode, and each connected in shunt relationship to the respective base and emitter of one of said transistor amplifiers, biased to inhibit transfer of power from its associated amplifier when in a conducting mode and further to provide current continuity through said electrical load in a predetermined direction defined by the polarization of such diodes and an applied input digital command signal,
(c) at least two transistor switches, operating in grounded-emitter saturated mode, each associated with one of said control diodes, and each coupled between the cathode of said associated diode and ground, and each having a base electrode responsive to signal bias, and
(d) at least two bias network means, each coupled to one of said transistor switch base electrodes for biasing each of said transistor switches respectively, and responsive to independent input digital signal command means,
whereby said electrical load is energized in a said predetermined polarity when only said first input command is applied to said first bias network means, to said opposing polarity when only said second input command is applied to said second bias network means, and deenergized when both said first and second commands are applied to their respective inputs,
(e) a first plurality of series-connected lamps coupled to the emitter of a first such transistor amplifier,
(f) a first diode, having an anode coupled to said first plurality of lamps, and a cathode coupled to the emitter of a second such transistor amplifier,
(g) a second plurality of series-connected lamps coupled to said emitter of said first amplifier, and
(h) a second diode, having a cathode coupled to said second plurality of lamps, and an anode coupled to said second amplifier emitter.

7. A bi-directional driver system for an inductive electrical load, said load having a first terminal and a second terminal; having two independent command inputs, operable from a power source supplying power between the system and ground so as to energize said load in a predetermined polarity in response to a first command signal applied to a first input, and in an opposing polarity in response to a second command signal applied to a second input, and for inhibiting operation when said first and second command signals are coincidentally but not necessarily simultaneously applied to their respective inputs, comprising:

(a) first amplifier means coupled to said power source for supplying energization to said electrical load, having first and second output terminals, said first output terminal coupled to said first terminal of said electrical load, and responsive to inhibitive bias from first unidirectional coupling means, (b) first switch means having an input and an output, said input responsive to said first command signal, and said output coupled to said second output terminal of said first amplifier, for commanding a first polarity of energization of said electrical load during said first switch operation, (c) said first unidirectional conducting means connected in shunt relationship with said first and second outputs of said first amplifier means and in series relationship with said first switch means output and said first terminal of said electrical load, biased to couple said electrical load to ground through said first switch means when said first switch means is energized by said first command signal, and further biased to inhibit operation of said first amplifier means when said first unidirectional conducting means is in a conductive mode, (d) second amplifier means coupled to said power source for supplying energization to said electrical load, having first and second output terminals, said first output terminal coupled to said second terminal of said electrical load, and responsive to inhibitive bias from second unidirectional coupling means, (e) second switch means having an input and an output, siad input responsive to said second command signal, and said output coupled to said second output terminal of said second amplifier, for commanding a second polarity of energization of said electrical load during said second switch operation, (f) said second unidirectional conducting means, connected in shunt relationship with said first and second outputs of said second amplifier and in series relationship with said second switch means output and said second terminal of said electrical load, biased to couple said electrical load to ground through said second switch means when said switch means is energized by said second command signal, and further biased to inhibit operation of said second amplifier means when said second unidirectinal conducting means is in a conductive mode, (g) said electrical load comprised of the primary winding of a transformer coupled to at least one secondary winding, (h) said first output terminal of said first amplifier means coupled by resistor-capacitor means to said second switch means input and to said power source, and (i) said first output terminal of said second amplifier means coupled by resistor capacitor means to said first switch means input and to said power source, whereby said bi-directional system is energized to operate in an astable multivibrator mode, with frequency determined by the cooperation of said resistor-capacitor networks with said power source.

8. The bi-directional driver as set forth in claim 7, further comprising rectifier means coupled to at least one of said transformer secondary windings, and filter means coupled to said rectifier means, for providing an isolated DC power supply at a voltage independent of said power source.

9. A bi-directional driver circuit for an electrical load having a first terminal and a second terminal, having two independent command inputs, operable from a power source supplying power between the system and ground so as to energize said load in a predetermined polarity in response to a first command signal applied to a first input, and in an opposing polarity in response to a second command signal applied to a second input, and for inhibiting operation when said first and second command signals are coincidentally but not necessarily simultaneously applied to their respective inputs, comprising:

(a) at least two transistor amplifiers, operating in emitter-follower linear mode, the emitter of each coupled to one of said terminals of said electrical load, for coupling said electrical load through a collector electrode to said power source when energized, and for deenergizing said load when base biased to cut-off, and each having a base electrode responsive to control bias from an associated control diode, (b) at least two said control diodes, each having an anode and cathode, and each connected in shunt relationship to the respective base and emitter of one of said transistor amplifiers, biased to inhibit transfer of power from its associated amplifier when in a conducting mode and further to provide current continuity through said electrical load in a predetermined direction defined by the polarization of such diodes and an applied input digital command signal, (c) at least two transistor switches, operating in grounded-emitter saturated mode, each associated with one of said control diodes, and each coupled between the cathode of said associated diode and ground, and each having a base electrode responsive to signal bias, and (d) at least two bias network means, each coupled to one of said transistor switch base electrodes for biasing each of said transistor switches respectively, and responsive to independent input digital signal command means, whereby said electrical load is energized in said predetermined polarity when only said first input command is applied to said first bias network means, to said opposing polarity when only said second input command is applied to said second bias network means, and deenergized when both said first and second commands are applied to their respective inputs, wherein said load is inductive, and further comprising:

a plurality of unidirectional conducting means, coupled between each of said inductive load first and second terminals and said power source and ground respectively, biased to be nonconducting during energization of said load, for suppressing inductive transient surges when said load is deenergized or reversed in polarity.

10. A bi-directional driver circuit for an electrical load, said load having a first terminal and a second terminal, having two independent command inputs, operable from a power source supplying power between the system and ground so as to energize said load in predetermined polarity in response to a first command signal applied to a first input, and in an opposing polarity in response to a second command signal applied to a second input, and for inhibiting operation when said first and second command signals are coincidentally but not necessarily simultaneously applied to their respective inputs, comprising:

(a) at least two transistor amplifiers, operating in emitter-follower linear mode, the emitter of each coupled to one of said terminals of said electrical load, for coupling said electrical load through a collector electrode to said power source when energized, and for deenergizing said load when base-biased to cut-off, and each having a base electrode responsive to control bias from an associated control diode, (b) at least two said control diodes, each having an anode and cathode, and each connected in shunt relationship to the respective base and emitter of one of said transistor amplifiers, biased to inhibit transfer of power from its associated amplifier when in a conducting mode and further to provide current continuity through said electrical load in a predetermined direction defined by the polarization of such diodes and an applied input digital command signal, (c) at least two transistor switches, operating in grounded-emitter saturated mode, each associated with one of said control diodes, and each coupled between the cathode of said associated diode and ground, and each having a base electrode responsive to signal bias, (d) at least two bias network means, each coupled to one of said transistor switch base electrodes for biasing each of said transistor switches respectively, and responsive to independent input digital signal command means, whereby said electrical load is energized in said predetermined polarity when only said first input command is applied to said first bias network means, to said opposing polarity when only said second input command is applied to said second bias network means, and deenergized when both said first and second commands are applied to their respective inputs, and (e) said electrical load further comprises a drive motor having an armature pivoted for rotation about an axis, an indicator member coupled for cooperative rotation with said armature, means responsive to said energization for rotating said armature about said axis in a first direction to a first position corresponding to said first command signal and for urging said armature against mechanical stop means, means responsive to said energization for rotating said armature about said axis to a second position in a direction opposing said first direction corresponding to said second command signal and for urging said armature against said mechanical stop means, spring means for returning said armature to a position intermediate said first and second positions when said armature is deenergized, and window means indicative of the position of said armature for displaying said indicator member in at least said first, second, and intermediate positions.

* * * * *